United States Patent [19]

Ito et al.

[11] Patent Number: 5,679,625
[45] Date of Patent: Oct. 21, 1997

[54] METHOD OF MAKING AN OXIDE SUPERCONDUCTING THIN FILM

[75] Inventors: Wataru Ito; Tadataka Morishita, both of Tokyo; Norio Homma, Sapporo; Yukihisa Yoshida, Tokyo, all of Japan

[73] Assignees: Nippon Steel Corporation; International Superconductivity Technology Center; Mitsubishi Electric Corporation, all of Tokyo; Hokkaido Electric Power Co., Inc., Sapporo, all of Japan

[21] Appl. No.: 563,905

[22] Filed: Nov. 22, 1995

Related U.S. Application Data

[63] Continuation of Ser. No. 117,537, Sep. 7, 1993, abandoned.

[30] Foreign Application Priority Data

Sep. 7, 1992 [JP] Japan .................................. 4-238708

[51] Int. Cl.$^6$ .................................................. C23C 14/34
[52] U.S. Cl. .......................... 505/476; 505/475; 505/731; 204/192.24
[58] Field of Search .................... 204/192.13, 192.15, 204/192.24, 298.08; 505/730, 731, 470, 433, 475, 476

[56] References Cited

U.S. PATENT DOCUMENTS

| | | | |
|---|---|---|---|
| 4,874,494 | 10/1989 | Ohmi | 204/192.12 |
| 5,180,476 | 1/1993 | Ishibashi et al. | 204/298.08 |

FOREIGN PATENT DOCUMENTS

| | | |
|---|---|---|
| 0 347 567 | 12/1989 | European Pat. Off. . |
| 63-26361 | 2/1988 | Japan . |
| 2-54764 | 2/1990 | Japan . |
| 3-13573 | 1/1991 | Japan . |
| 3-249171 | 11/1991 | Japan . |

OTHER PUBLICATIONS

Homma et al., "Crystallinity of a-axis oriented YBaCuO thin film epitaxially grown on NdGaO (110) by 95 MHz magnetron sputtering", Appl. Phys. lett., vol.59 (11) pp.1383–1385 Sep. 1991.

Nakagawa et al., "Substrate Bias and Pessure Effect on Formation of YBaCuO Thin Films in RF Magnetron Sputtering System", Japanese Journal of Applied Physics vol. 30, No. 6A, pp. L 993–L 996 Jun. 1991.

Li et al., "In situ preparation of Y–Ba–Cu–O Superconducting Thin Films by Magnetron Sputtering", Appl.Phys. Lett. 52(13), pp. 1098–1100 Mar. 1988.

(List continued on next page.)

*Primary Examiner*—R. Bruce Breneman
*Assistant Examiner*—Rodney G. McDonald
*Attorney, Agent, or Firm*—Wenderoth, Lind & Ponack

[57] ABSTRACT

A method of making a superconducting thin film of a Y—Ba—Cu—O series material by using a diode parallel plate type sputtering apparatus including a vacuum chamber, a substrate disposed within the vacuum chamber and having a substantially flat surface on which the superconducting thin film is to be formed, and a plate-shaped target functioning as a cathode and disposed within the vacuum chamber to parallelly face to the flat surface of the substrate, the target being made of the same material as the superconducting thin film, a plasma gas being introduced into the vacuum chamber, and a voltage being applied between the cathode and the substrate, wherein the method comprises the steps of applying a high frequency voltage having a frequency higher than 40 MHz between the cathode and the substrate to generate plasma of the introduced gas, superimposing a DC voltage (V) on the high frequency voltage in a polarity that the cathode becomes negative, and setting the DC voltage at a value where the DC voltage is substantially unchanged with variation of a cathode current flowing through the target when adjusting the DC voltage and controlling a value of the DC current while maintaining the DC voltage substantially at the set value.

7 Claims, 6 Drawing Sheets

OTHER PUBLICATIONS

Nakagawa et al., Japanese Journal of Applied Physics, vol. 30, Jun. 1991 No. 6A, Part 2, Tokyo, Japan pp. L993–L996.

Tsai et al., Journal of Physics, vol. 69, No. 4, 15 Feb., 1991 New York, New York, pp. 2731–2733.

Li et al., Appl. Phys. Lett., vol. 52 (13) 28 Mar. 1988 pp. 1098–1100.

Eom et al., Physica C171 (1990) pp. 354–382.

Migliuolo et al., Appl. Phys. Lett., vol. 56 (25) 18 Jun. 1990 pp. 2572–2574.

Homma et al., Appl. Phys. Lett., vol. 59 (11) 9 Sep. 1991 pp. 1383–1385.

Klein et al., Appl. Phys. Lett., vol. 55 (25) 18 Dec. 1989 pp. 2670–2672.

Appl. Phys. Lett. 59 (11), 9 Sep. 1991 pp. 1383–1385, Homma et al.

×50,000

×50,000

METHOD OF MAKING AN OXIDE SUPERCONDUCTING THIN FILM

This application is a continuation of now abandoned application Ser. No. 08/117,537, filed Sep. 7, 1993.

BACKGROUND OF INVENTION

1. Field of the Invention

The present invention relates to a method of making an oxide superconducting thin film and more particularly, to a method of making an oxide superconducting thin film of a Y—Ba—Cu—O series by sputtering.

2. Description of the Related Art

The oxide superconducting thin film of the Y—Ba—Cu—O series is utilized in the electronics field such as a sensor or electronic device, and as a known method of fabricating the superconducting thin film, there is a fabricating method based on diode parallel plate type sputtering.

This diode parallel plate type sputtering is convenient when compared with other methods and is excellent in the controllability of the composition of the product. When an oxide target is used, however, oxygen negative ions emitted from the target are accelerated through a cathode sheath so that the oxygen particles having high energy disadvantageously act to vary the composition of the thin film and to impede its crystallization.

For the purpose of solving this problem, there have been proposed various countermeasures which include the following methods (1) to (4).

(1) Film formation is carried out under a sputtering gas pressure of a high level which is higher by several to several tens mTorr than a normal pressure, e.g., several hundred mTorr, thereby to decrease the density of high energy particles. (For example, refer to H. C. Li et al: Appl. Phys. Lett. 52(13), 28 Mar. 1988, pp. 1098–1100).

(2) The position of the target relative to the substrate is changed from a position where the target is parallel to the substrate by rotating the target or substrate by 90° degrees to a position where the target is at a right angle to the substrate (off-axis sputtering method) thereby preventing the high energy particles from colliding directly against the substrate. (For example, refer to C.E. Eom et al; Physics C171 (1990) pp. 354–382).

(3) A strong magnetic field is applied to thereby lower a plasma sustaining voltage and to reduce a cathode sheath voltage, thus suppressing generation of high energy particles. (For example, refer to M. Migliuolo et al: Appl. Phys. Lett. 56(25) 18 Jun. 1990, pp. 2572–2574).

(4) The cathode sheath voltage is lowered with use of a sputtering method using a frequency band of 94.92 MHz 7 times as high as an ordinarily-employed high frequency band of 13.56 MHz to thereby to suppress generation of the high energy particles. (For example, refer to N. Homma et al: Appl. Phys. Lett. 59(11), 9 Sep. 1991 pp. 1383–1385).

However, any of these methods has a problem that the film growth rate is reduced.

Improvement in crystallization of the film is important not only in its application research but also in its physical property research. Conventionally, in order to improve the film crystallization, various studies and researches have been conducted including the initial selection of a film formation technique, the research for the optimum film formation temperature, the use of a substrate selected in consideration of the matching of a lattice constant and the optimization of the film growth rate for hetero-epitaxial growth. However, since the film growth mechanism necessary for the hetero-epitaxial growth has not been clear, it has been impossible to obtain a remarkable advancement in the improvement of the crystallization and much attention has been directed exclusively to the improvement of the superconducting properties.

As has been explained above, the improvement of the crystallization has been made at the sacrifice of the improvement of the efficiency in formation of the thin film. In other words, the prior art method has a technical defect that, for the purpose of minimizing the influences of high energy particles, the flux of other depositing particles becomes smaller. Further, even by sacrificing the efficiency, the level of the crystallization obtained by the prior art film formation method is not so high.

SUMMARY OF THE INVENTION

It is an object of the present invention to solve the above problems in the prior art and to provide a method of making an oxide superconducting thin film of a Y—Ba—Cu—O series, preferably a $YBa_2Cu_3O_x$ (x=6.5–7) series, which is excellent in crystallization.

In accordance with one aspect of the present invention, there is provided a method of making an oxide superconducting thin film of a Y—Ba—Cu—O series material by using a diode parallel plate type sputtering apparatus including a vacuum chamber, a substrate disposed within the vacuum chamber and having a substantially flat surface on which the superconducting thin film is to be formed, a plate-shaped target functioning as a cathode and disposed within the vacuum chamber to parallelly face to the flat surface of the substrate, the target being made of the same material as the material of the superconducting thin film, means for introducing a sputtering gas into the vacuum chamber, and means for applying a voltage between the cathode and the substrate. The method comprises the steps of applying a high frequency voltage having a frequency higher than 40 MHz between the cathode and the substrate by the voltage application means, to generate plasma of the sputtering gas superimposing a DC voltage on the high frequency voltage in such a polarity that the cathode becomes negative, setting the DC voltage at a value where the DC voltage is substantially unchanged with variation of a cathode current flowing through the target when adjusting the DC voltage and controlling a value of the DC current while maintaining the DC voltage at the set value.

The diode parallel plate type sputtering apparatus used in the present invention is substantially the same as the prior art apparatus, except that means for superimposing the DC voltage is added. That is, in order to implement the method of the present invention, the means for superimposing the DC voltage is newly provided.

In the diode parallel plate type sputtering apparatus, a self-bias appearing on the target used as the cathode can be advantageously made lower by using the high frequency voltage of a frequency band, such as 40 MHz or more, higher than 13.56 MHz which is ordinally used.

This means that the energy of negative oxygen ions as sputtered from the target can be made lower, and hence the use of the high frequency voltage of 40 MHz or more is highly effective in improving the crystallization of the film. Further, when a frequency of 40 MHz or more is employed, the distribution of energy of argon ions can be made sharp. This means that the influences of high energy part of the argon can be eliminated and hence it is also effective in improving the crystallization of the film. At the same time, however, the lower self bias will result in reducing the sputtering efficiency. Accordingly, in order to obtain a suitable film growth rate, it becomes necessary to limit the sputtering atmosphere to a low pressure or high vacuum level. The limitation of the sputtering atmosphere to the low pressure causes the film to be influenced directly by the necessarily existing high energy particles thereby causing re-sputtering of the film, resulting in damage of the film. Thus, it has been demanded to develop a process of obtaining a sufficient film growth rate under a low vacuum condition where the resputtering of the film can be prevented.

Inventors of the present invention have studied and found that, when an electrically conductive target made of a YBCO series material containing Y, Ba and CuO at atomic ratios of 1:2:3 is used, a high frequency of 40 MHz or higher, preferably 94.92 MHz is employed to generate a plasma and at the same time, a negative DC bias is applied to the cathode, a DC plasma can be superimposed to form a hybrid plasma. The inventors have also found that a sufficient film growth rate can be obtained by using the hybrid plasma even when the sputtering pressure is increased up to such a level that the re-sputtering can be completely suppressed. In this manner, the method of the present invention has been developed.

It is known to apply a DC voltage and a high frequency voltage superimposed thereon between the cathode and the substrate in the sputtering apparatus, as disclosed in, for example, JP-A-63-26361, JP-A-2-54764, JP-A-3-13573, JP-A-3-249171. However, in these prior art systems, the high frequency voltage is superimposed on the DC voltage in order to prevent the target from being excessively charged by the DC voltage or to facilitate the sputtering at a low gas pressure. Thus, the purpose of any of the prior art systems is different from that of the present invention.

BRIEF DESCRIPTION OF THE DRAWINGS

FIGS. 8A and 8B are high-resolution SEM photographs of the structure of the film of FIG. 6 magnified by 50000 times, wherein FIG. 8A shows a cross-sectional view of the film and FIG. 8B shows a view of a slant surface (75-degree tilt).

DESCRIPTION OF THE PREFERRED EMBODIMENTS

An embodiment of the present invention will be explained with reference to the accompanying drawings.

Figure 1:
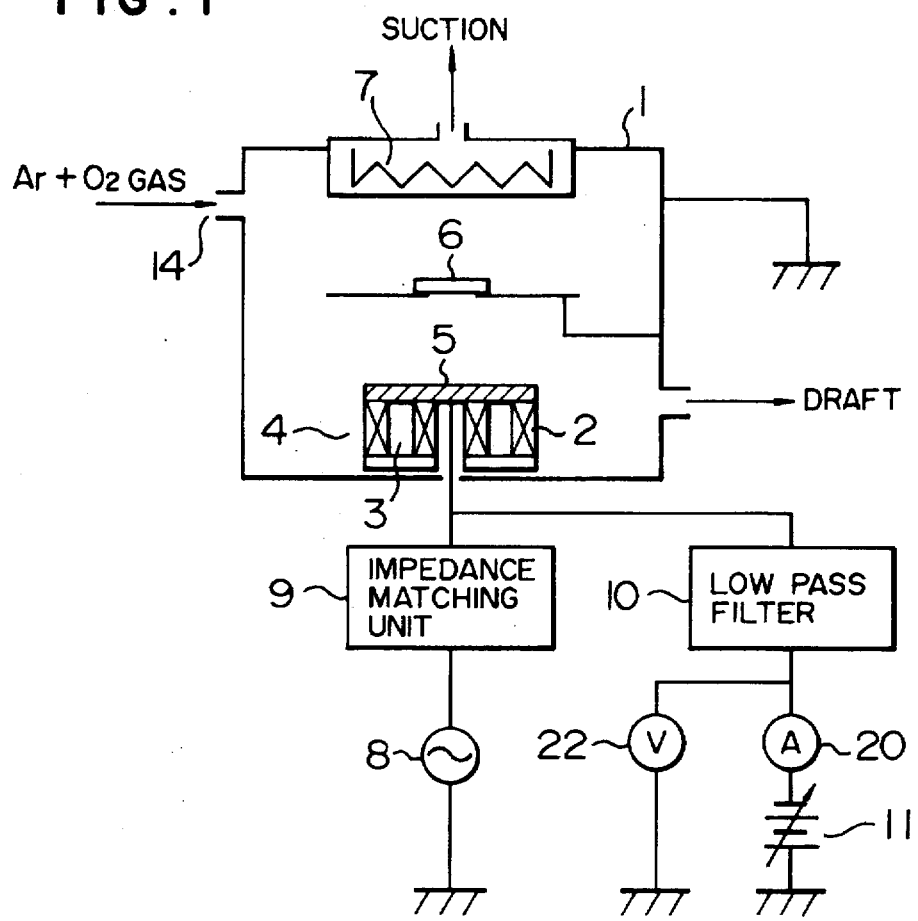
FIG. 1 shows a schematic arrangement of a diode parallel plate type sputtering apparatus in accordance with an embodiment of the present invention.

Referring first to FIG. 1, there is schematically shown an arrangement of a diode parallel plate type sputtering apparatus used in an embodiment of the present invention. However, the present invention is not limited to the use of this apparatus but may be modified as necessary in various ways without departing from the subject matter of the present invention.

In FIG. 1, a film growth chamber 1 is a vacuum chamber, which is at a pressure on the order of $1 \times 10^{-7}$ Torr. Introduced into the film growth chamber 1 is a mixture gas of argon and oxygen for plasma generation. The pressure of the introduced mixture gas is held at a predetermined level by controlling the exhaust rate of the introduced mixture gas. A cathode 4, which supports a target 5, is provided with a magnet 2 for locally increasing plasma density and a cooling water path 3. The target, which is made of the material of a superconducting thin film to be formed, is formed into a thin disk shape having a substantially flat surface. A substrate 6 is disposed above the target 5 such that the lower surface of the substrate is opposing and in parallel relationship to the upper surface of the target 5 with a distance of about 30 mm between them. The superconducting thin film is formed on the surface of the substrate 6 opposite to the target. The substrate 6 is heated to a predetermined temperature by a heater 7 disposed backward of the substrate. The film growth chamber case 1 is made of a metallic material and the substrate 6 is grounded through the chamber case. A high frequency voltage having a frequency of 94.92 MHz is applied between the cathode 4 and the substrate 6 through an impedance matching unit 9 from a high frequency power source 8. On this high frequency voltage, a DC voltage is superimposed through a low pass filter 10 by a constant voltage/constant current DC power source 11 in a polarity such that the cathode becomes negative. The low pass filter 10 is provided for preventing the high frequency voltage from being applied to the DC power source 11. The aforementioned diode parallel plate type sputtering apparatus has substantially the same structure as the prior art one, except for the DC power source 11 and the low pass filter 10. As the DC power source 11, it is desired to use a constant voltage/constant current DC power source such as, GP-R Series manufactured by Takasago LTD. 662, Futago-ku, Kawasaki-city, Kanagawa, Japan, which is capable of controlling the allowable maximum voltage and the allowable maximum current independently of each other.

Explanation will next be made of examples of the method of making a superconducting thin film in accordance with the present invention by using the above system. In the following embodiments, the substrate 6 was made of $SrTiO_3$ or $NdGaO_3$.

EXAMPLE 1

Figure 2:
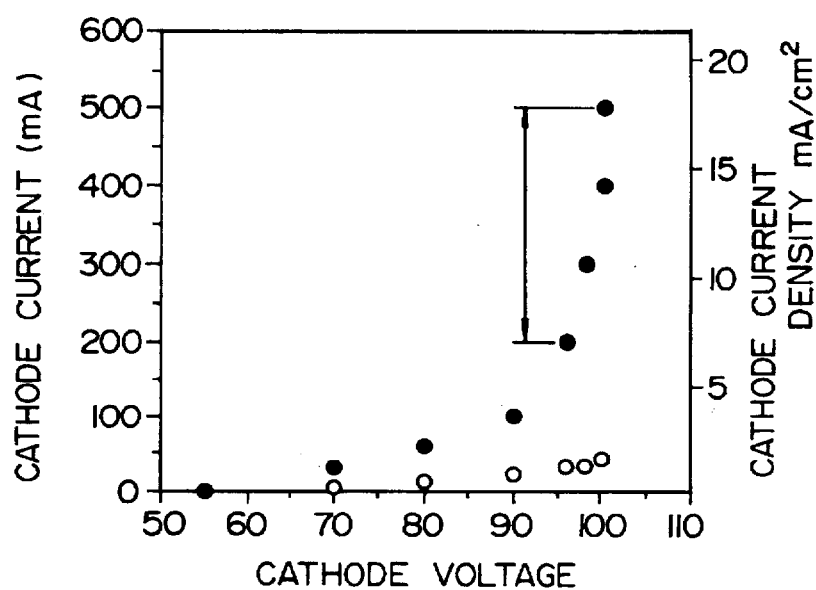
FIG. 2 shows the relationship between DC voltage (cathode potential) and cathode current when a high frequency voltage and a DC voltage superimposed on the high frequency voltage are applied to a cathode (target)

A target made of a YBCO series material is used, a high frequency voltage having a frequency of 94.92 MHz is applied between the cathode and substrate from the high frequency power source 8 to generate plasma of the introduced gas, the DC voltage from the DC power source 11 is superimposed on the high frequency voltage in such a polarity that the cathode becomes negative, and the cathode voltage is gradually increased. This causes the cathode current to be also increased. The values of the cathode voltage and cathode current A are monitored on a voltmeter 22 and an ammeter 20, respectively. When the cathode voltage reaches a certain value, the cathode current starts abruptly increasing, while variation of the cathode voltage is very small as compared with the increase in the cathode current. In FIG. 2, black dots show the relationship between the cathode voltage and cathode current when the YBCO series circular target has a composition of Y, Ba and CuO at atomic ratios of 1:2:3, respectively, (which target will be referred to merely as 1:2:3 YBCO target, hereinafter), a diameter of 60 mm and a thickness of 1.5 mm. In this case, the cathode current varies in a range of 0.2–0.6 A and the cathode voltage is kept at a constant level of about 100 V. Although the surface current density of the cathode is not uniform over the whole surface area of the circular target having a diameter of 60 mm, the current value of 0.2–0.6 A corresponds to an average current density of about 7–21 mA/cm$^2$. Accordingly, in the case of the 1:2:3 YBCO series target, when sputtering is carried out under a condition that the cathode voltage is set at 100 V, the cathode average current density is kept at a constant value in the range of 7–21 mA/cm$^2$, e.g., at 17 mA/cm$^2$, the formation of the superconducting thin film can be optimized. Under such a condition, cathode voltage cannot be controlled because the cathode voltage is maintained at its constant voltage region. However, so long as the cathode current is kept at 17 mA/cm$^2$ through the current control, slight variation of the voltage has no troubles.

With variation of the cathode voltage, the cathode current varies differently depending on the Y:Ba:O composition ratios of the YBCO series target. In FIG. 2, white plot dots show the relationship between the cathode current and the cathode voltage when a 1:3:7 YBCO series target is used. In this case, the rate in variation of the current caused by variation of the voltage is small and thus it is impossible to obtain such a condition that the cathode voltage is kept substantially at a constant level with variation of the cathode current.

This difference is concerned largely with the electric conductivity of the target. That is, when a target having a small electric resistance is employed, the voltage drop of the bias voltage across the target is small so that a negative voltage potential generates on the surface of the target and the DC plasma is superimposed on a high frequency plasma in a gaseous phase having a large electric conductivity. A current flowing through the DC plasma provides the cathode current flowing through the target having a small electric resistance. Thus, even when the 1:2:3 composition target is employed, the voltage/current characteristic may vary depending on the thickness of the target.

The above specific variation of the current value is caused by the electrical characteristics of the target as mentioned above, and is not limited to the 1:2:3 composition target. In other words, even when film formation is carried out using a target having a composition selected according to the thin film to be formed, the formation of the superconducting thin film can be realized taking advantage of this feature of the high frequency plus DC plasma so long as a suitable electric conductivity is given to the target.

When the electric conductivity is not so high, however, the value of the DC voltage where the cathode current is abruptly increased becomes remarkably large. When the superimposed bias voltage exceeds 200 V, the characteristics of the DC plasma are so emphasized that the characteristics of the high frequency plasma cannot be utilized and also the problem of re-sputtering again appears, thus remarkably deteriorating the crystallization of the film. Accordingly, it is desirable to restrict the cathode potential to 200 V or less.

The aforementioned plasma specific behaviors can be confirmed clearly not only from the voltage/current characteristic but also from visual observation. The optical emission of the plasma element in the visual region was spectroscopically analyzed. In this case, a spectroscope having a focal distance of 500 mm and a grating with 1200 grooves/mm and a multi-channel analyzer having a 1024 silicon diode array were used to detect the emission intensity.

Figure 3A:
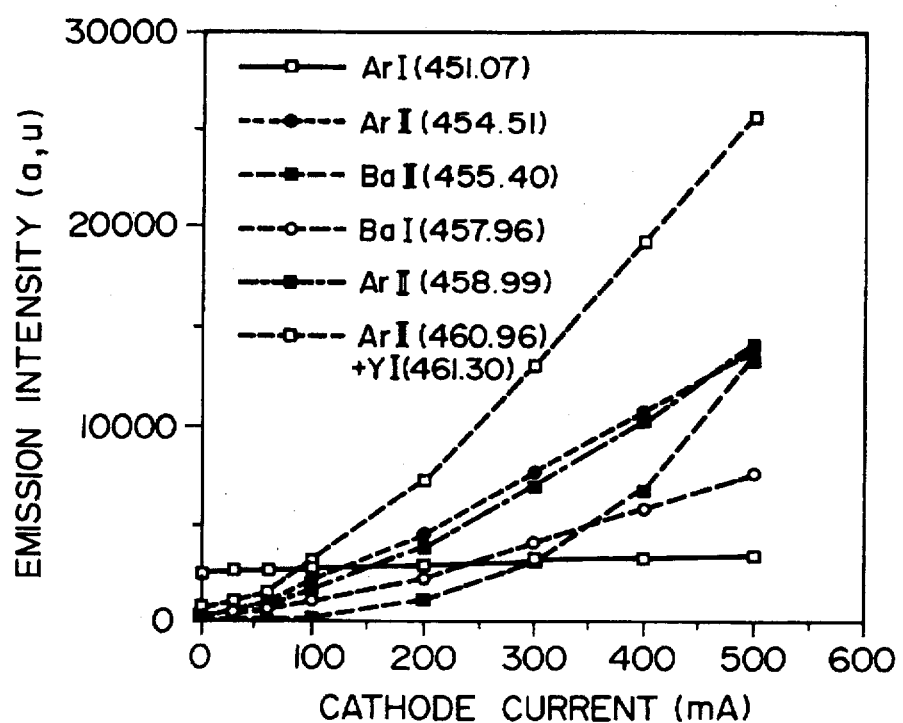
FIGS. 3A and 3B show emission intensity-to-cathode current characteristic curves, each representing a relationship between the intensity (arbitrary unit) of light emitted from each of the elements forming the plasma and the cathode current obtained from spectroscopic analysis of the plasma optical emission in the visible region.
Figure 3B:
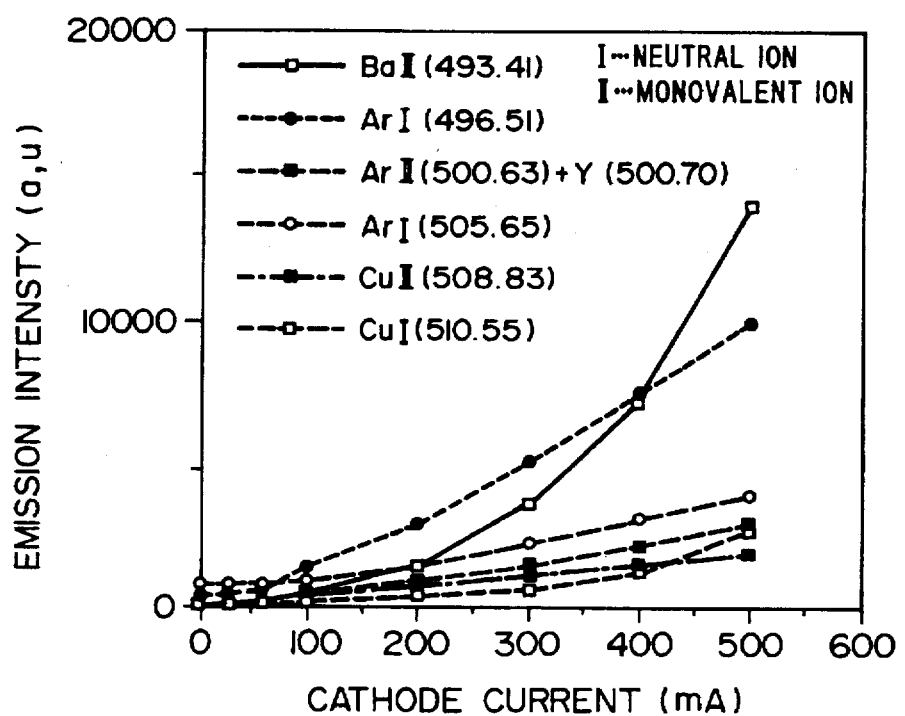

The results are shown in FIGS. 3A and 3B. More specifically, FIGS. 3A and 3B show various values of the intensity of typical optical emission peaks existing in wavelength ranges of about 20 nm with centers of 400, 450 and 500 nm, respectively, which are the spectrum wavelengths of respective elements forming the introduced gas and YBCO target with respect to variation of the cathode current. Except for part of an argon sputtering gas, most emission intensities are increased with the increase of the cathode current. In particular, with respect to the metal of the target especially having monovalent ions, its emission intensity is remarkably increased. When compared with the ordinary sputtering wherein optical emission of only the sputtering gas (argon, in this example) and reaction gas (oxygen gas in this example) can be observed (for example, refer to J. D. Klein et al; Appl. Phys. Lett. 55((25) 18 Dec. 1989, pp. 2670–2672) 2670), an increase in the sputtering rate and remarkable improvement in the ionization efficiency are remarkably observed in the plasma of the present embodiment. Accordingly, when the plasma is used according to the invention, there can be realized high-speed formation of a superconducting thin film having an excellent crystallization.

EXAMPLE 2

Figure 4:
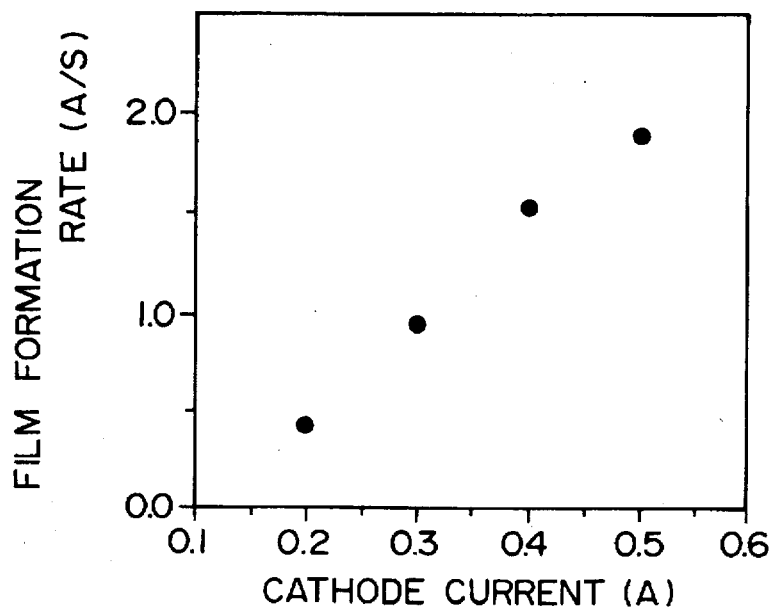
FIG. 4 shows the relationship between the cathode current and yhe film growth rate in formation of a superconducting thin film made of Y—Ba—Cu—O series material.

Under a condition that a circular target having a diameter of 60 mm, a thickness of 1.5 mm includes a 1:3:7 composition, a cathode bias is set at −100 V so that the cathode current is several tens mA and no DC plasma is superimposed, and the film growth chamber is set at a pressure of 200 mTorr, the film formation was carried out. The result was such that due to compositional change caused by film re-sputtering, the composition ratio of a resultant film was 1:2:3. In this case, the film formation rate was 7 angstroms/min. When a 1:2:3 composition target was used in the same system and the cathode current was set at 0.5 A, the cathode bias was set at −100 V which is the same as that used for the 1:3:7 target. By increasing the sputtering pressure to 600 mTorr, the compositional change was suppressed and a superconducting thin film of the target composition was obtained. In this case, the cathode current was 0.5 A. When the sputtering film formation was carried out with no superimposed DC plasma under the sputtering pressure of 600 mTorr by using, for example, the 1:3:7 composition target, the film growth rate was 0.1 angstroms/min or less, i.e. substantially no film growth. In the present embodiment using the superimposed DC plasma, on the other hand, the film growth rate of 100 angstroms/min. or more was obtained. In this conjunction, the film growth rate was calculated based on the deposition time and the film thickness which was determined by observing the section of the obtained film by a high-resolution scanning electron microscope (SEM). FIG. 4 shows an example of the relationship between the cathode current and the film growth rate in formation of a YBCO film by the method of the present invention.

As the sputtering pressure is made higher, the influences of the re-sputtering can be more greatly reduced. However, when the sputtering pressure exceeds 2 Torr, the flux of element sputtered from the target cannot reach the substrate due to very short mean free path of the flux. Thus, it is desirable to set the upper limit of the sputtering pressure at 2 Torr.

EXAMPLE 3

Under a typical deposition condition of a sputtering pressure of 600 mTorr, a cathode bias of −100 V and a cathode current of 0.5 A, a film was formed on an $NdGaO_3$ substrate respectively at different film growth temperatures. Each of the films obtained at different film growth temperatures was subjected to evaluation of its crystalline structure by X-ray diffractometry. In the processes, the temperature as measured in the vicinity of a heater 7 was regarded as the film growth temperature and the temperature control was made by referring to the measured temperature. Since the actual temperature on the surface of the substrate is lower than the measured temperature, a calibration of the measured temperature to the actual substrate surface temperature was made prior to the film growth. It was found that the actual temperature on the substrate was about 100° C. lower than the measured temperature. The results of evaluations are given in FIG. 5.

Figure 5:
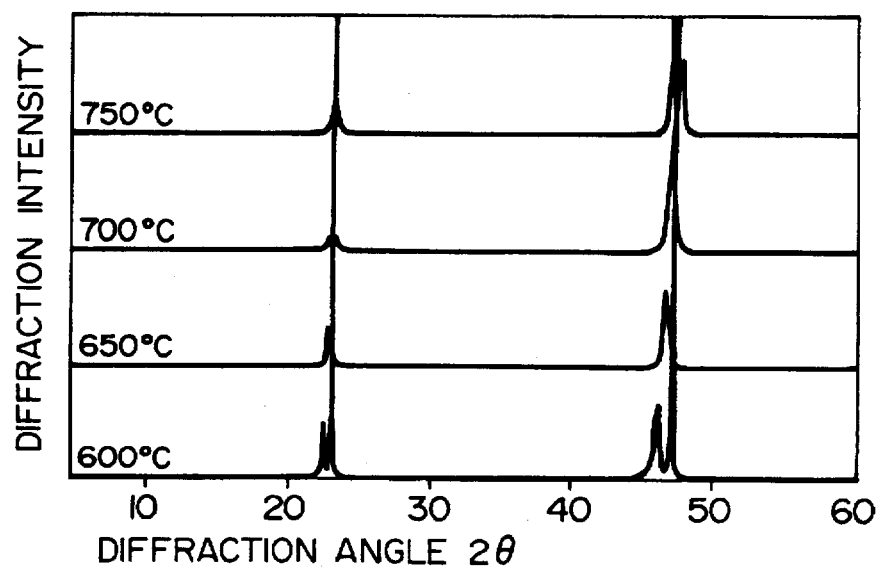
FIG. 5 shows the relationship between the diffraction angle and the diffraction intensity in an X-ray diffractometry with respect to different film growth temperatures.

In more detail, FIG. 5 shows X-ray diffraction patterns, each indicating a relationship between diffraction angle 2θ and a diffraction intensity. It will be clearly understood from the X-ray diffraction patterns that all the films exhibit the property of the superconducting structure (a-axis orientation) in the tested temperature range and as the film growth temperature is decreased, the a-axis length becomes shorter. This tendency can be explained from the differences in thermal expansion coefficient between the film as formed and the substrate, and thus this method is useful for performing ideal epitaxial growth of a superconducting thin film.

In the method, the substrate temperature is selected at a temperature in a range of 600°–900° C. This is because, when the substrate temperature is lower than 600° C., the crystallization of the resultant film is remarkably deteriorated, while, when the temperature exceeds 900° C., the flatness of the film surface is remarkably deteriorated. The surface flatness will be explained later in connection with Example 4.

EXAMPLE 4

Figure 6:
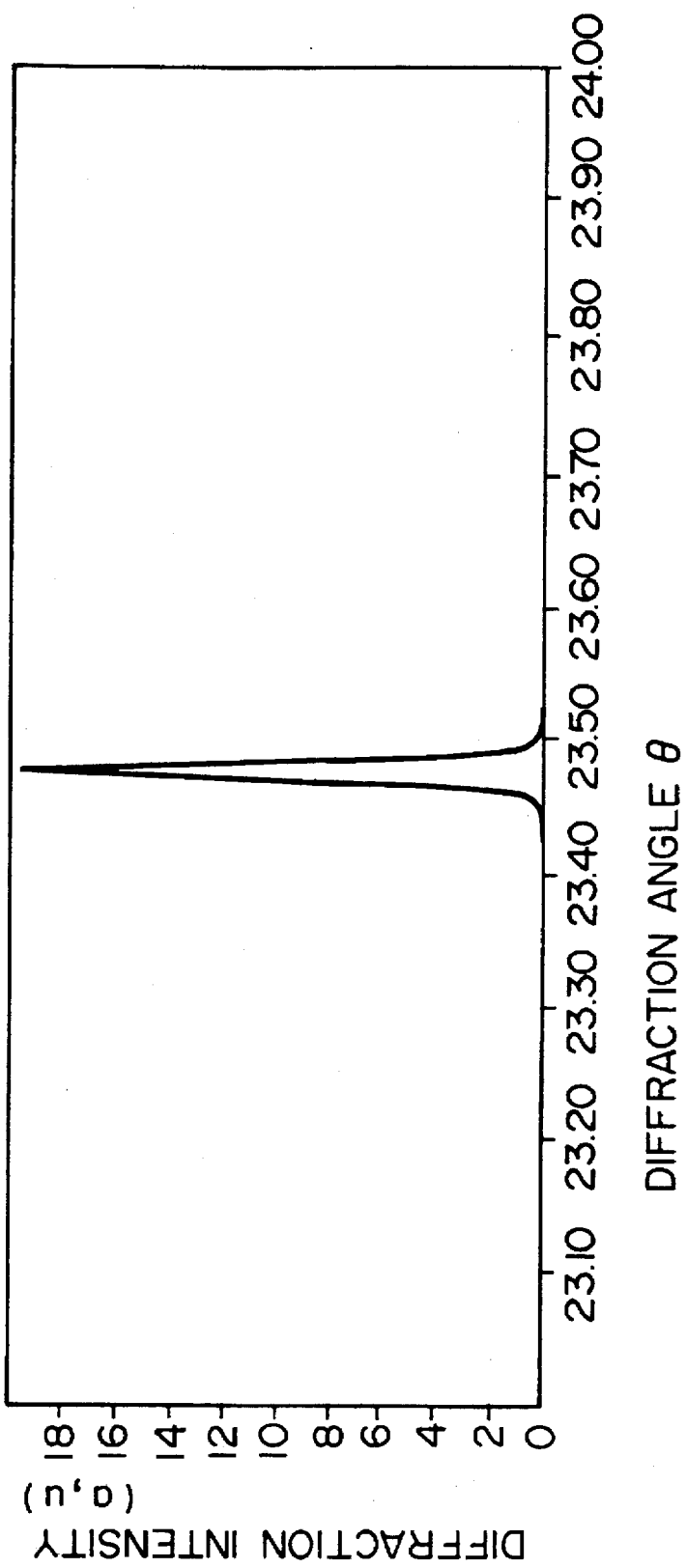
FIG. 6 shows the relationship between the diffraction angle and the diffraction intensity (arbitrary unit) obtained through the measurement of a rocking curve of (200) X-ray diffraction peak in a Y—B—C—O series film made in accordance with the present invention.

As a result of studying the optimal condition for the film growth by using the apparatus shown in FIG. 1, it has been found that the condition that the sputtering pressure is 475 mTorr (Ar: $O_2$=1; 2) and the cathode current is 0.5 A is useful. Under this condition, formation of a superconducting thin film was carried out on $SrTiO_3$ and $NdGaOs_3$ substrates and resultant films were subjected to evaluations. From measuring of a rocking curve most often used in the evaluation of crystallization based on the X-ray diffractometry, it has been found that the resultant films are of a complete a-axis type, the 'fall width at half maximum' of the rocking curve of (200) X-ray diffraction peak is 0.02 degrees, which is the smallest among values so far reported, and the films have substantially the same excellent crystallization as a single crystalline substrate. The rocking curve by the X-ray diffraction is shown in FIG. 6.

Figure 7:
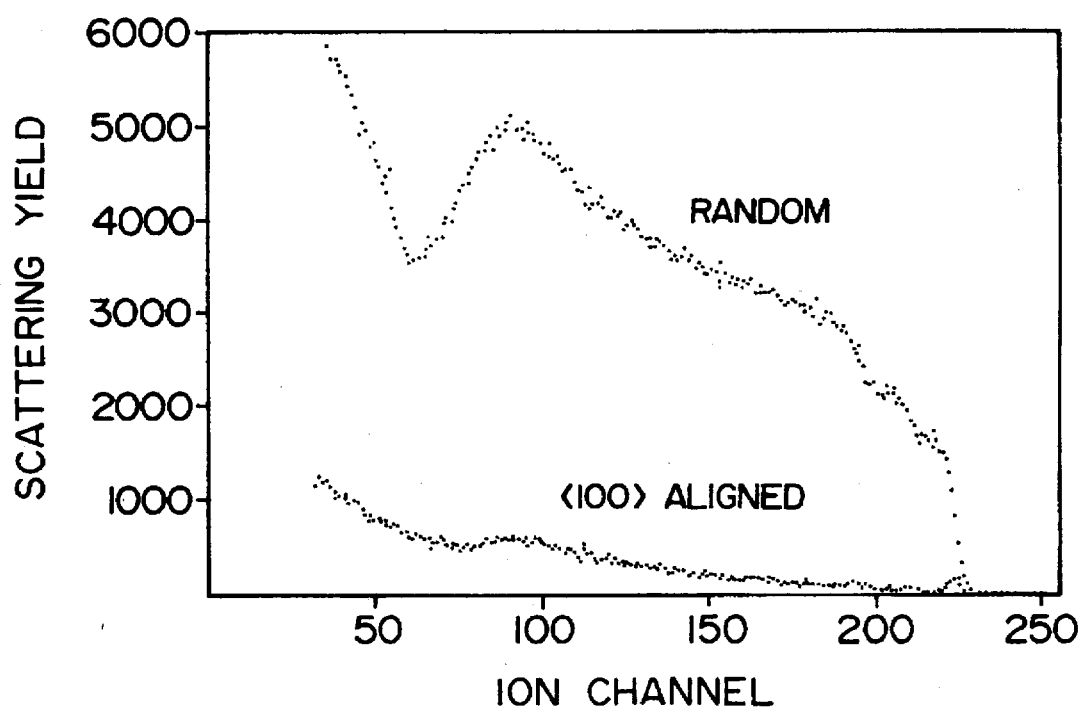
FIG. 7 is a graph showing the Rutherford backscattering spectrum for the film of FIG. 6.

Further, the same films were evaluated with respect to crystallization by a Rutherford backscattering channeling method, but it was found that a value λmin indicative of crystallization was 2% (calculated in the vicinity of the Ba surface), which was the smallest among the values so far reported, i.e., the films were excellent in crystallization. The results of evaluation by the Rutherford backscattering channeling method are given in FIG. 7.

Figure 8A:
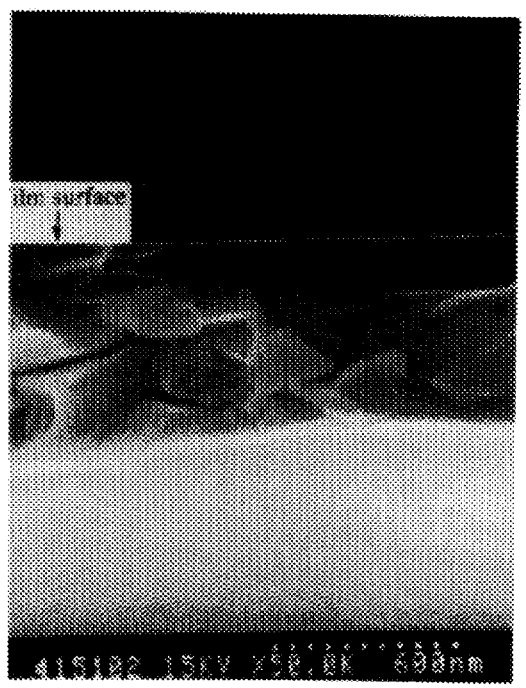
Figure 8B:
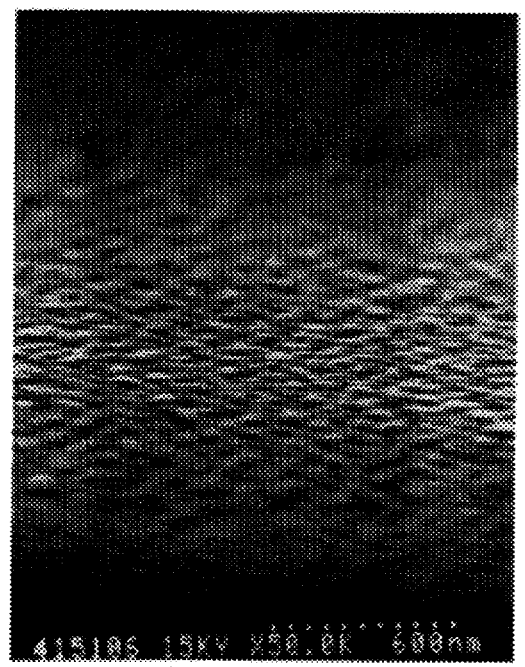

By observing the section and slanted section (at a 75 degree tilt at which the surface roughness is highly emphasized) of the thin films formed in this example by a high-resolution SEM, it has been confirmed that the surface of the thin films is very flat. The SEM images are given in FIGS. 8A and 8B. It has been observed from the figures that the surface roughness is 50 angstroms or less.

In accordance with the present invention, a breakthrough has been made in improving the crystallization of a superconducting thin film, which could not be advanced largely so far. In other words, the crystallization of the film reaches a level of the crystallization of the substrate, i.e., the crystallization of the film has reached substantially as high as an ideal level on principle. In accordance with the present invention, it has been found that a superconducting thin film having an a-axis orientated YBCO structure, which is highly excellent in crystallization and high in surface smoothness, can be obtained. This can contribute largely to techniques for fabricating an electronic device having a multilayered structure.

We claim:

1. A method of making a superconducting film having a composition of $YBa_2Cu_3O_x$, wherein x=6.5–7, by using a diode parallel, plate type sputtering apparatus including a vacuum chamber, a substrate disposed within said vacuum chamber and having a substantially flat surface on which said superconducting film is to be formed, and a plate-shaped target functioning as a cathode and disposed within said vacuum chamber to parallelly face the flat surface of said substrate, said method comprising the steps of:

using, as said target, a target made of the same material as said superconducting film to be made;

introducing a plasma gas into said vacuum chamber;

applying a high frequency voltage having a frequency higher than 40 Mhz between said cathode and said substrate to generate plasma of said plasma gas introduced into said vacuum chamber;

superimposing a DC voltage on said high frequency voltage in a polarity that makes said cathode negative relative to said substrate; and setting the DC voltage at a value where the DC voltage is substantially unchanged with variation of a cathode DC current flowing through the target by adjusting the DC voltage and controlling the value of the DC current while maintaining the DC voltage substantially at the set value.

2. A method according to claim 1, wherein the frequency of said high frequency voltage is 94.92 MHz.

3. A method according to claim 2, wherein the value of said cathode current is controlled while setting said cathode at a negative potential of about 100 volts.

4. A method according to claim 2, wherein said cathode is set at a negative potential so that a current density of said cathode current per 1 $cm^2$ of a surface area of said target is at a selected value in a range of 7–21 mA.

5. A method according to claim 1, wherein said DC voltage is set so as to cause said cathode to be set at a negative potential of 200 V or less.

6. A method according to claim 1, further comprising a step of setting the pressure of said gas introduced into said vacuum chamber at a selected value in a range of 200 mTorr to 2 Torr.

7. A method according to claim 1, further comprising a step of setting the temperature of said substrate at a selected value in a range of 600°–900° C.

* * * * *